(12) United States Patent
Hayashi et al.

(10) Patent No.: US 8,921,213 B2
(45) Date of Patent: Dec. 30, 2014

(54) METHOD OF MAKING LESS ELECTRIC CURRENT DEPENDENCE OF ELECTRIC CURRENT GAIN OF SEMICONDUCTOR DEVICE

(71) Applicant: National Institute of Advanced Industrial Science and Technology, Tokyo (JP)

(72) Inventors: Yutaka Hayashi, Tsukuba (JP); Yasushi Nagamune, Tsukuba (JP); Toshitaka Ota, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 14/039,719

(22) Filed: Sep. 27, 2013

(65) Prior Publication Data

US 2014/0030878 A1    Jan. 30, 2014

Related U.S. Application Data

(63) Continuation of application No. PCT/JP2012/052256, filed on Feb. 1, 2012.

(30) Foreign Application Priority Data

Mar. 28, 2011   (JP) ................................. 2011-069468

(51) Int. Cl.
| | | |
|---|---|---|
| *H01L 21/04* | (2006.01) | |
| *H01L 29/66* | (2006.01) | |
| *H01L 29/08* | (2006.01) | |
| *H01L 29/417* | (2006.01) | |
| *H01L 29/732* | (2006.01) | |
| *H01L 29/10* | (2006.01) | |
| *H01L 21/02* | (2006.01) | |
| *H01L 21/18* | (2006.01) | |
| *H01L 29/06* | (2006.01) | |

(52) U.S. Cl.
CPC ...... *H01L 29/66234* (2013.01); *H01L 29/0821* (2013.01); *H01L 29/41708* (2013.01); *H01L 29/66272* (2013.01); *H01L 29/7322* (2013.01); *H01L 29/1004* (2013.01); *H01L 29/0692* (2013.01)
USPC ............. 438/510; 257/E21.002; 257/E21.085

(58) Field of Classification Search
None
See application file for complete search history.

(56) References Cited

U.S. PATENT DOCUMENTS

| 4,691,223 A | 9/1987 | Murakami et al. |
| 4,881,111 A | 11/1989 | Sanders |

(Continued)

FOREIGN PATENT DOCUMENTS

| EP | 1 211 733 A1 | 6/2002 |
| JP | 61-114574 A | 6/1986 |

(Continued)

OTHER PUBLICATIONS

International Search Report for PCT/JP2012/052256, Mailing Date of Apr. 17, 2012.

(Continued)

*Primary Examiner* — Calvin Choi
(74) *Attorney, Agent, or Firm* — Westerman, Hattori, Daniels & Adrian, LLP (57) ABSTRACT

An object of the present invention is to amplify the current which varies by a factor of several orders of magnitude with a constant gain without using a complicated circuit. In order to solve the problem, with a semiconductor device includes a first semiconductor region of a first conductivity, a second semiconductor region which is an opposite conductivity opposite to the first conductivity and is in contact with the first semiconductor region and a third semiconductor region which is the first conductivity and is in contact with the second semiconductor region at the second surface, a fourth semiconductor region in contact with the second semiconductor region is provided so as to be separated from the third semiconductor region and enclose the third semiconductor region and an impurity concentration of the fourth semiconductor region is larger than that of the second semiconductor region.

4 Claims, 7 Drawing Sheets

(56) References Cited

U.S. PATENT DOCUMENTS

| | | |
|---|---|---|
| 6,897,546 B1 | 5/2005 | Sakamoto |
| 2003/0178701 A1 | 9/2003 | Beasom |

FOREIGN PATENT DOCUMENTS

| | | |
|---|---|---|
| JP | 01-125975 A | 5/1989 |
| JP | 09-321056 A | 12/1997 |
| JP | 2001-189318 A | 7/2001 |

OTHER PUBLICATIONS

S. M. Sze, "Physics of Semiconductor Devices", Second Edition, John Wilyand Son.

L. Treitinger et al. "Ultra-Fast Silicon Bipolar Technology", Springer-Verlag.

International Prliminary Report on Patentability dated Oct. 2, 2013 for PCT/JP2012/052256, forms PCT/IB/373 and PCT/ISA/237 (7 pages).

Extended European Search Report dated Aug. 14, 2014, issued in corresponding European Application No. 12763747.8 (6 pages).

Japanese Office Action dated Jul. 29, 2014, issued in corresponding JP application No. 2011-069468 with English translation (9 pages).

METHOD OF MAKING LESS ELECTRIC CURRENT DEPENDENCE OF ELECTRIC CURRENT GAIN OF SEMICONDUCTOR DEVICE

CROSS-REFERENCE TO RELATED APPLICATION

This application is a continuation application of International Application PCT/JP2012/052256, filed on Feb. 1, 2012, which claims the benefit of priority of the prior Japanese Patent Application No. 2011-069468, filed on Mar. 28, 2011, the entire contents of which are incorporated herein by reference.

FIELD

The present invention relates to a method of making less electric current dependence of the electric current gain of a semiconductor device and specifically relates to a method making less electric current dependence on the base electric current or on the collector electric current of a bipolar transistor.

BACKGROUND

A conventional bipolar transistor is known for the fact that the electric current gain is small in a very low electric-current level, large in a middle electric-current level and small again due to a high level injection effect in a high electric-current level. For example, it is described as a typical example in pages 142-143 and FIG. 7 of non-patent document 1 that the electric current gain is 35 at the collector electric current of 100 pA, and increases by approximately one order of magnitude according to the increase of the collector electric current to reach the maximum gain of 400 at about 100 µA, and then decreases for larger collector electric current.

Figure 1:
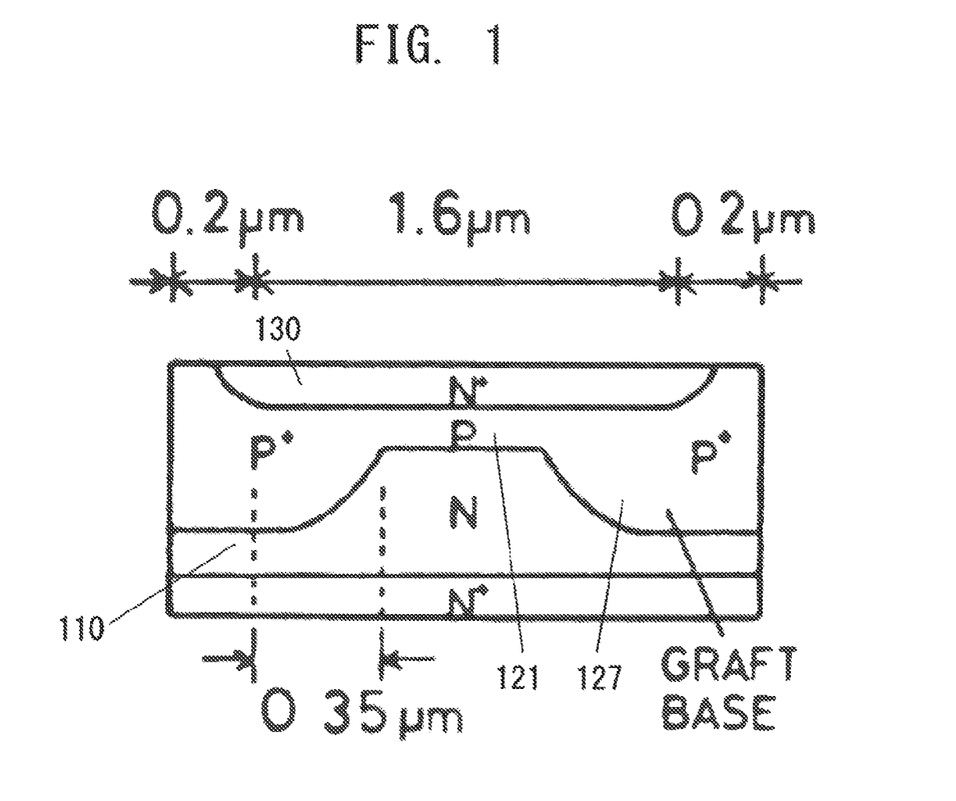
FIG. 1 is a sectional view of a conventional graft base transistor.

On the other hand, a graft base transistor structure is conventionally known for achieving a small external base electric resistance and improving the high frequency characteristics. As illustrated in FIG. 6.12(A) in page 106 of non-patent document 2, this structure is a structure in which a high-impurity-concentration base region (graft base 127) is extended from an edge surface of an emitter 130 laterally to under the emitter and buried therein. In this case, when the high-impurity-concentration base region is separated from the emitter, the electric resistance from the region to an intrinsic base 121 under the center of the emitter becomes high and therefore this is not advantageous. FIG. 1 illustrates a sectional view of a transistor having the graft base structure extracted from FIG. 6.12(A) of non-patent document 2. In FIG. 1, the high-impurity-concentration base region 127 is extended with a length of 0.35 µm from the edge of the emitter 130 to under the emitter and buried therein. In FIG. 1, the reference numeral 110 is the collector, the reference numeral 121 is the intrinsic base, the reference numeral 127 is the graft base and the reference numeral 130 is the emitter. These reference numerals are overwritten in FIG. 6.12(A).

This graft base transistor is not developed for improving the electric current dependence of the electric current gain. Since the graft base transistor is developed for improving the high frequency characteristics, the operating range mainly covers large electric current and less emphasis is put on the very low electric-current level.

Thus, the structure in which the high-impurity-concentration part of the high-impurity-concentration base region of the graft base transistor has contact with the emitter increases the leakage electric current between the emitter and the base. This may lead the decrease of the electric current gain in the very low electric-current level near the value of the leakage electric current. Therefore, the range of the collector electric current, for which the gain variation is small, is unfavorably narrowed. In addition, the breakdown voltage between the base and the emitter becomes small and the application voltage range of the transistor is narrowed, which is not preferable.

[Non-patent Document 1]
S. M. Sze, "Physics of Semiconductor Devices", second edition, John Wiley and Sons.
[Non-patent Document 2]
L. Treitinger, M. Miura-Mattausch, "Ultra-Fast Silicon Bipolar Technology", Springer-Verlag

SUMMARY

However, in order to amplify the current which varies by a factor of several orders of magnitude with a constant gain without using a complicated circuit, a bipolar transistor of which the electric current dependence of the electric current gain (the rate of output electric current (collector electric current or emitter electric current) to input electric current (base electric current): $\beta$ or hfe) is small in a several orders of magnitude is required.

It is an object in the present invention to:
1) suppress the electric current gain variation occurred in the above conventional technique,
2) and, prevent the decrease of the breakdown voltage between the base and the emitter.

In the present invention, a measure in which a high-impurity-concentration region is provided on the surface of the base so as to be separated from the emitter and enclose the emitter is taken to solve the above problems. Namely, this can be described in terms of a device structure as follows.

(1)
A method of making less electric current dependence of the electric current gain of a semiconductor device:
the semiconductor device at least including;
a first semiconductor region having a first surface, a first thickness and a first conductivity;
a second semiconductor region having a second surface, a second thickness, an opposite conductivity opposite to the first conductivity and in contact with the first semiconductor region at a part of the first surface;
a third semiconductor region having a third surface, a third thickness, the first conductivity and in contact with the second semiconductor region at a part of the second surface; and
an impurity concentration of the third semiconductor region being larger than that of a part of the second semiconductor region which is in contact with the third semiconductor region,
the method comprising:
providing a fourth semiconductor region having a fourth surface, a fourth thickness, an opposite conductivity type and in contact with the second semiconductor region at a part of the second surface; and
making the fourth semiconductor region so as to be separated from the third semiconductor region and to enclose the third semiconductor region and making an impurity concentration of the fourth semiconductor region larger than that of the second semiconductor region.

Since this device is used as not only a transistor but also an amplifying sensor having a favorable linearity, this device is referred to as "semiconductor device".

Figure 3:
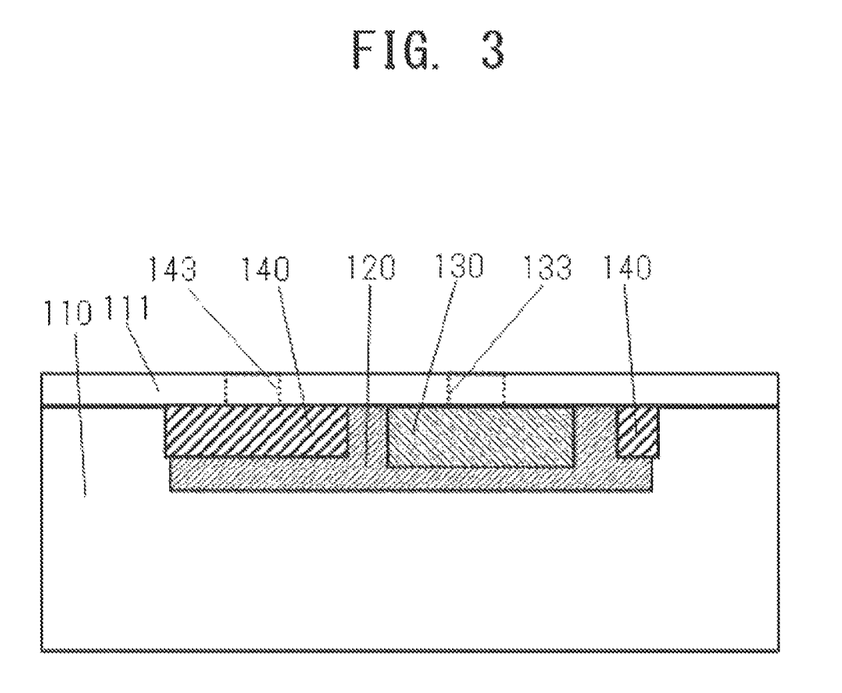
FIG. 3 is a sectional view in the embodiment illustrated in FIG. 2.

In addition, the expression "have contact with . . . on (a part of) a surface" includes a case in which a device is provided "on" the surface and a case in which a device is provided "in" the surface (refer to FIG. 3 as described later). Also, the term "opposite conductivity" means p-type (hole with regard to carrier) when the first conductivity is n-type (electron with regard to carrier) and n-type (electron with regard to carrier) when the first conductivity is p-type (hole with regard to carrier).

In the present invention, since the fourth semiconductor region, of which the impurity concentration is larger than that of the second semiconductor region, is separated from the third semiconductor region, the increase of the leakage electric current and the decrease of the breakdown voltage due to the graft base transistor configuration are prevented. The separation distance therebetween is required to be a distance with which the breakdown voltage between the second semiconductor region and the third semiconductor region does not considerably decrease, such as 0.06 micron for 3 V breakdown voltage.

It is known that the reason why "the electric current gain is small in the very low electric-current level" in the conventional transistor is the bulk recombination of minority carriers at the bulk recombination center in the second semiconductor region and the surface recombination caused at the surface recombination center on the second surface of the second semiconductor region.

Since the effects of these recombinations become small when the electric current flowing between the first semiconductor region and the third semiconductor region (corresponding to the collector electric current and the emitter electric current) becomes large, the ratio (electric current gain) of the electric current flowing between the first semiconductor region and the third semiconductor region to the electric current required for the second semiconductor region (corresponding to the base electric current) becomes large. However, in an electric current level in which the effect of the surface recombination is small, the increase of the electric current gain is prevented, when the fourth semiconductor region is provided.

It is desirable that the distance between the third semiconductor region and the fourth semiconductor region is shorter than the diffusion length of the minority carriers in the second semiconductor region in order to achieve the effect of the prevention of the increase of this electric current gain. When a semiconductor is silicon and the impurity concentration is about 1E18 atoms/cc, this distance is about 20 micron. Since the lifetimes of the minority carriers are controlled by the defect density (a cause of the recombination center, as described later), the impurity concentration and the temperature-time history at the time of manufacturing a device (including the cooling down time from a high temperature), the diffusion length which represented by the square root of "a product of the diffusion constant of the minority carriers and the lifetime thereof" depends on the impurity concentration and the processing condition of manufacturing a device.

The fourth semiconductor region is not required to enclose the third semiconductor region by a closed shape. A semiconductor device according to the present invention can also be as follows.

(2)

A method of making less electric current dependence of the electric current gain of a semiconductor device according to (1) described above, wherein the fourth semiconductor region includes an opening in a plane shape which encloses the third semiconductor region, and a dimension of a shortest distance of the opening is equal to or smaller than one-tenth of a length of an inner perimeter of the plane shape which encloses the third semiconductor region.

In the method according to (2), even when there is a part (the opening) which is not entirely enclosed by the fourth semiconductor region around the third semiconductor region, the increase of the electric current gain is prevented at the part in which the opposite conductivity carriers flow out of the fourth semiconductor region into the second semiconductor region. Additionally, even when the part is shorter than the length of the opening, the effect of the present invention is achieved when the length of the opening is equal to or shorter than the length of the inner perimeter where the fourth semiconductor region encloses the third semiconductor region.

(3)

In order to achieve the prevention of the increase of this electric current gain, the impurity concentration of the fourth semiconductor region is more than or equal to 10 times as large as that of the second semiconductor region.

In order to increase the electric current gain to be equal to or larger than 1, the impurity concentration of the third semiconductor region is required to be larger than that of the second semiconductor region.

Although, conventionally, feedback loops are added to an analog amplifier circuit employing a number of transistors in order to achieve a constant electric current gain which is independent of the electric current level, in a semiconductor device in the present invention an almost constant electric current gain regardless of the electric current level is achieved by employing a simple structure.

DESCRIPTION OF EMBODIMENTS

Figure 2:
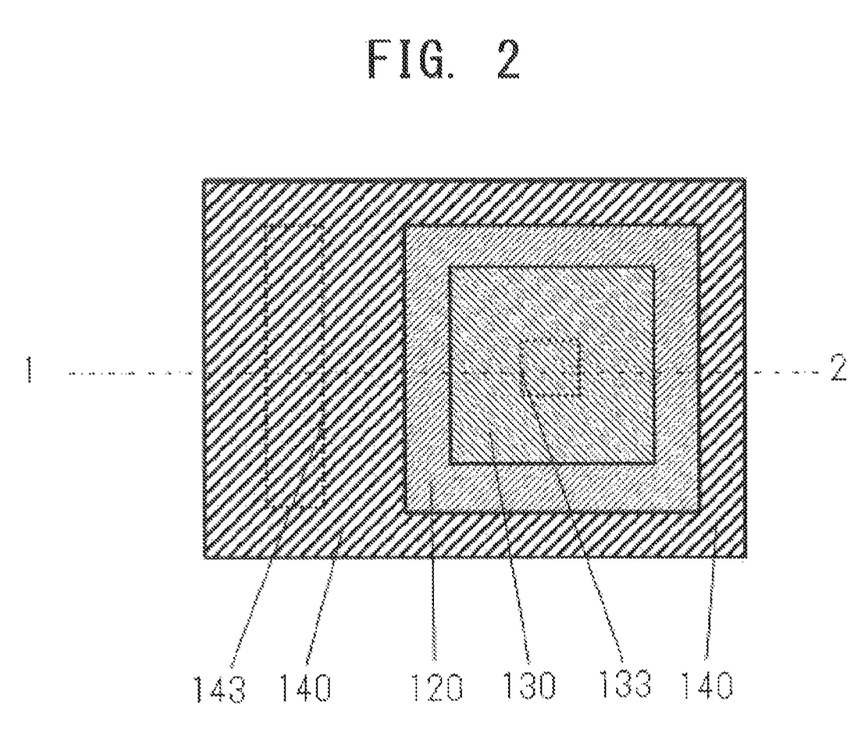
FIG. 2 is a plane view illustrating an embodiment according to the present invention.

FIG. 2 illustrates a plane view of a semiconductor device in an embodiment according to the present invention. FIG. 3 is a sectional view of the semiconductor device sectioned along the 1-2 dotted and dashed line in the plane view illustrated in FIG. 2. In the diagrams, the reference numeral 110 denotes the first semiconductor region. The reference numeral 111 denotes an insulating film which is provided on the first, second, third, fourth surfaces for the purpose of passivation. The reference numeral 120 denotes the second semiconductor region provided so as to be in contact with the surface of the first semiconductor region. The reference numeral 130 denotes the third semiconductor region provided so as to be in contact with the surface of the second semiconductor region. The reference numeral 140 denotes the fourth semiconductor region provided so as to be separated from the third semiconductor and be in contact with the surface of the second semiconductor region. Unlike graft base, the fourth semiconductor region is not buried under the third semiconductor region. The reference numeral 133 denotes a contact hole to the third semiconductor region provided in the insulating film 111, and the reference numeral 143 denotes a contact hole to the fourth semiconductor region provided in the insulating film 111. Electrodes for each region are omitted for simplicity.

An n-type (100) face oriented silicon substrate with a resistivity of 10-20 Ωcm is used as the first semiconductor region 110. The surface impurity concentration of the second semiconductor region 120 is about 1E18 atoms/cc, and the second thickness (depth) is about 2 micron. The surface impurity concentration of the third semiconductor region is about 9E20 atoms/cc, and the third thickness is submicrometer which is equal to or smaller than 0.5 micron. The surface impurity concentration of the fourth semiconductor region 140 is 1E20 atoms/cc, and the fourth thickness is smaller than the third thickness. With these configurations, a semiconductor device according to one aspect of the present invention as illustrated in FIGS. 2 and 3 is manufactured by use of a CMOS process.

Figure 4:
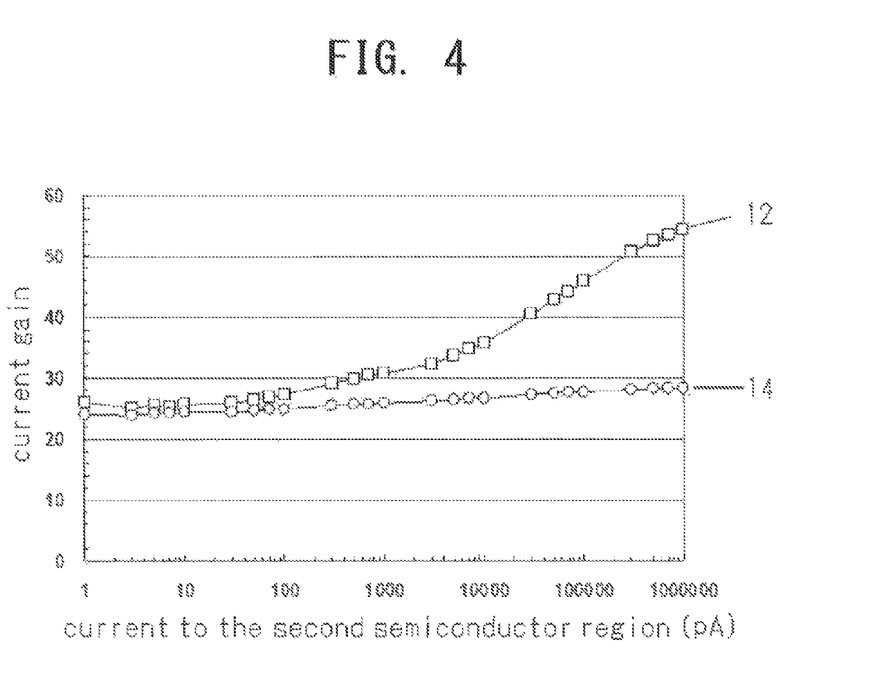
FIG. 4 illustrates the electric current dependence of the gain regarding a semiconductor device manufactured with reference to the plane view in the embodiment illustrated in FIG. 2.

The curve 14 depicted in FIG. 4 illustrates the dependence of the electric current gain on the electric current to the second semiconductor region of the fabricated semiconductor device. In this semiconductor device, the electric current gain is already obtained as small as 1 pA in the electric current to the second semiconductor region. The electric current gain of this semiconductor device only increases from 24 to 28 for the 6-digit variation from 1 pA to 1000000 pA (1 μA) in the electric current to the second semiconductor region. By contrast, the curve 12 depicted in FIG. 4 illustrates the electric current gain of a semiconductor device in which the fourth semiconductor region 140 is excluded in the structure illustrated in FIG. 2, and the electric current gain of this device varies more than twice as much from 26 to 54 in reference for the variation from 1 pA to 1000000 pA in the electric current to the second semiconductor region. The above comparison validates that the fourth semiconductor region according to one aspect of the present invention advantageously suppresses the variation of electric current gain.

Since a clean MOS process is employed in this fabrication example, the electric current to the second semiconductor region is amplified at 1 pA even in a device in which the fourth semiconductor region is excluded. However, when the surface impurity concentration of the second semiconductor region is smaller than that of the above fabrication conditions, for instance, approximately 1E17 atoms/cc or lower or when the clean MOS process is not employed, the second surface turns to depletion or inversion. Therefore, without the fourth semiconductor region, a leak channel may be formed on the second surface of the second semiconductor region to bypass between the third surface of the third semiconductor region and the first surface of the first semiconductor region, and the electric current gain may significantly decrease such as equal to or smaller than 1. Here, with the fourth semiconductor region provided, since this leak channel is blocked the electric current gain is ensured even in a very low electric-current level.

Figure 5:
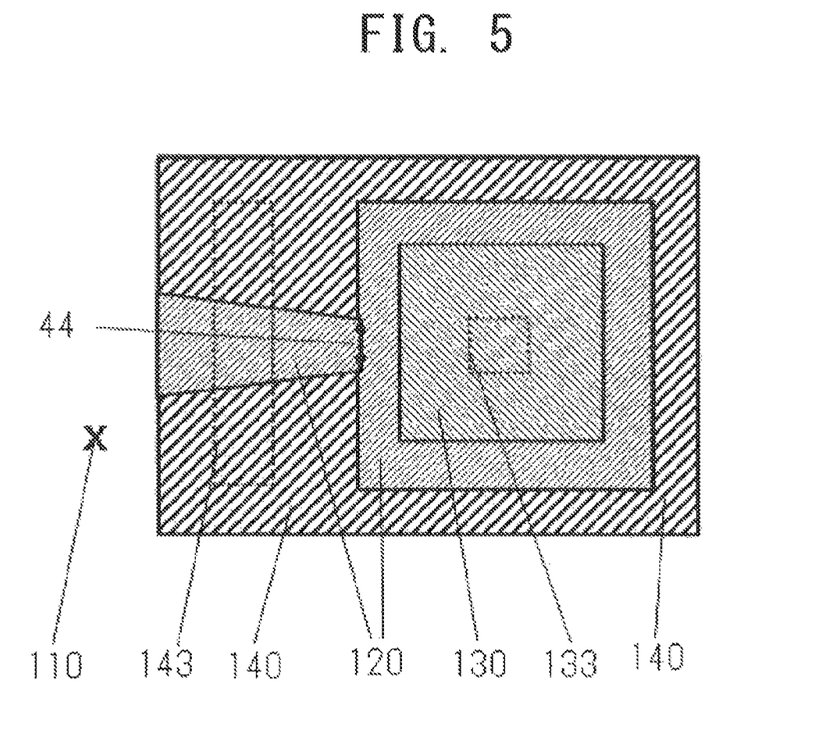
FIG. 5 is a plane view exemplifying an opening in the plane shape of the fourth semiconductor region.

FIG. 5 illustrates an embodiment in which the shape of the fourth semiconductor region 140 is not a closed shape like an alphabet O but a planar shape having an opening like an alphabet C. In FIG. 5, the same reference numerals as in FIG. 2 mean the same regions and features. The reference numeral 44 denotes the dimension of the smallest part of the opening. In the semiconductor device illustrated in FIG. 5, even an opening with a dimension of about 2-3 micron does not diminish an effect of suppressing the electric current dependence of the current gain under the above described fabrication conditions in connection with FIG. 2.

Figure 6:
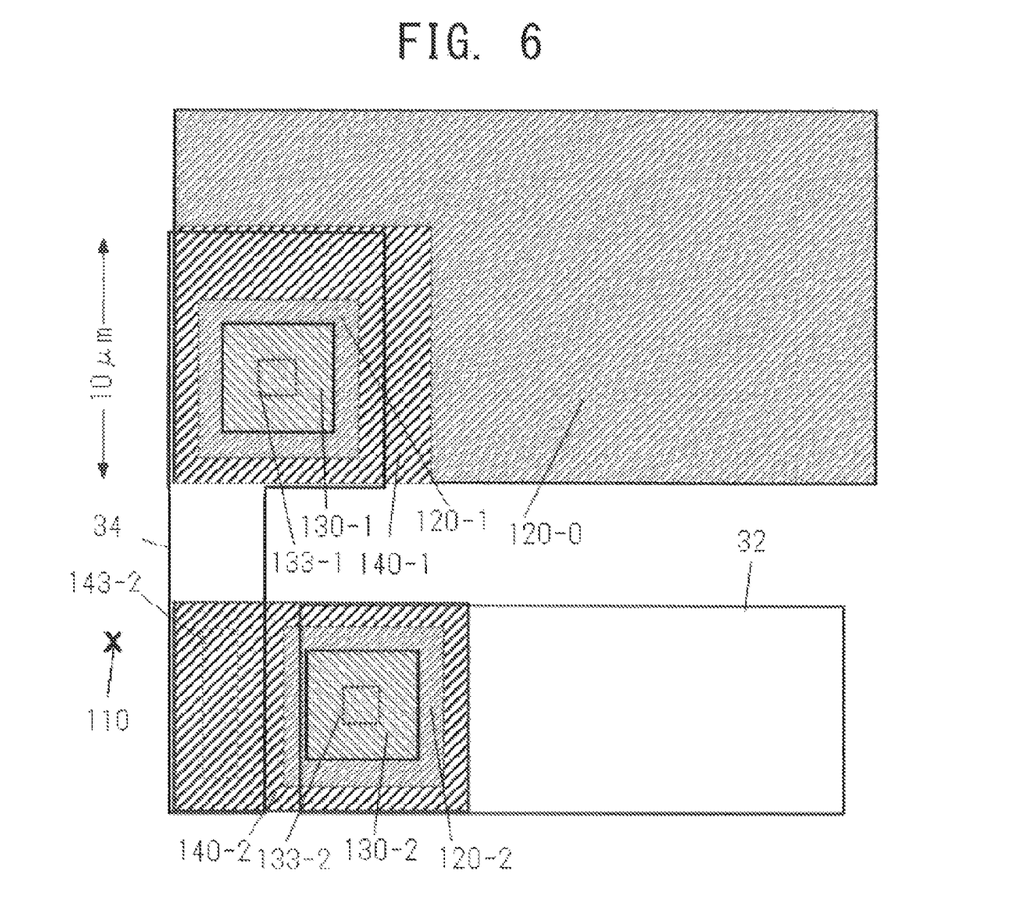
FIG. 6 illustrates an embodiment in which one aspect of the present invention is applied to an amplifying photoelectric conversion device.

FIG. 6 illustrates a plane view of an embodiment in which the present invention is applied to an amplifying photoelectric conversion device. The device is fabricated by use of the same design rule and fabrication techniques as in FIG. 2. The reference numeral 120-0 denotes the second semiconductor region for photoelectric conversion, and forms a photodiode for converting light input P into photocurrent along with the first semiconductor region 110. The reference numeral 120-1 denotes the second semiconductor region (first base) of the first amplifying transistor which is in connection with this photodiode. The reference numeral 130-1 denotes the third semiconductor region (first emitter). The reference numeral 140-1 denotes the fourth semiconductor region. The reference numeral 120-2 denotes the second semiconductor region (second base) of the second amplifying transistor. The reference numeral 130-2 denotes the third semiconductor region (second emitter) of the second amplifying transistor. The reference numeral 140-2 denotes the fourth semiconductor region of the second amplifying transistor.

The third semiconductor region 130-1 of the first amplifying transistor is connected to the fourth semiconductor region 140-2 of the second amplifying transistor via thin film wiring 34 through a contact hole 133-1 and a contact hole 143-2. Since the second semiconductor region 120-2 (second base) of the second amplifying transistor is continuous with the fourth semiconductor region 140-2, the second semiconductor region 120-2 is connected to the third semiconductor region 130-1 (first emitter) of the first amplifying transistor.

Consequently, the light electric current converted by the first semiconductor region 110 and the second semiconductor region 120-0 is amplified by the first and second amplifying transistors and obtained from the third semiconductor region 130-2 or the first semiconductor region. FIG. 6 illustrates that a lead out electrode 32 is provided through a contact hole 133-2 from the third semiconductor region 130-2. The gain is a product of each electric current gain of individual amplifying transistors.

Amplified light electric current is obtained as Iout2 from the lead out electrode 32. In addition, when pulse driving is performed between the first semiconductor region 110 and the third semiconductor region 130-2, pulse electric current for recharging electric charge which has been discharged by light electric current from the junction capacitors provided between the first semiconductor region 110 and the second semiconductor regions 120-0 and 120-1 is amplified and obtained from the lead out electrode 32.

Figure 7:
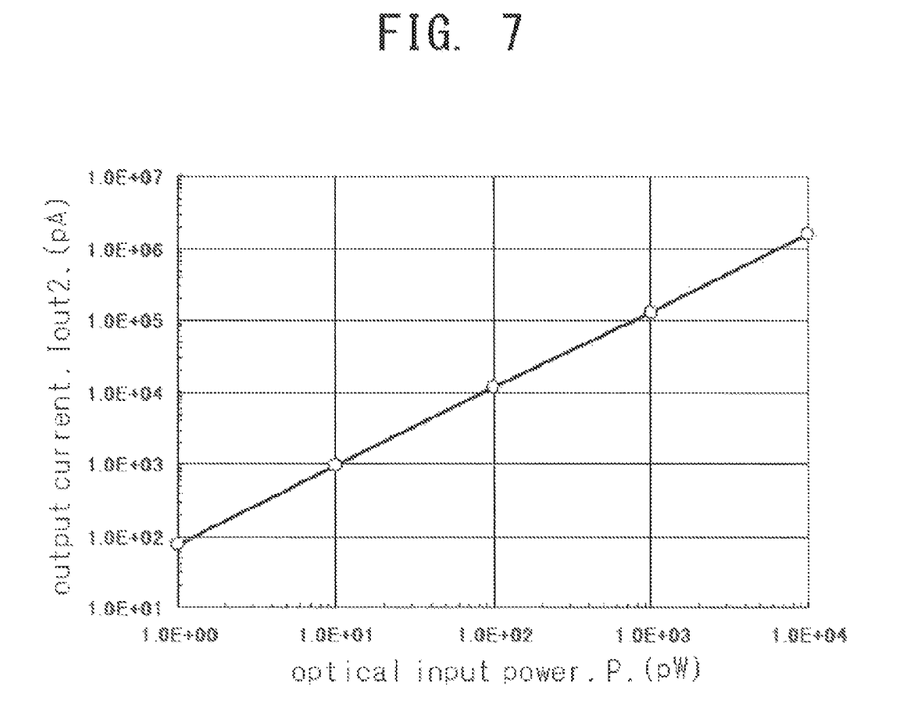
FIG. 7 illustrates electrical properties in the embodiment illustrated in FIG. 6.

FIG. 7 illustrates direct-electric-current Iout2 (picoampere) obtained from the third semiconductor region 130-2 with reference to the light input energy P (picowatt) of the amplifying photoelectric conversion device illustrated in FIG. 6. A voltage of 1.5 V is applied between the first semiconductor region and the third semiconductor region 130-2. The light source is He—Ne laser. As illustrated in FIG. 7, almost linear output electric current Iout2 is obtained with reference to the light input energy P. When it is assumed that Iout2 is proportional to P to the nth power, n=1.07 is obtained as a result, which is approximate to n=1.

With a semiconductor device according to one aspect of the present invention, a constant electric current gain is achieved with a simple configuration regardless of the electric current level. Therefore, by use of the semiconductor device according to one aspect of the present invention, an amplifying sensor with a small area is realized. As a result, a large-scale array is realized with high sensitivity amplifying sensor cells.

What is claimed is:

1. A method of making a semiconductor device, in which an electric current gain is less dependent upon an electric current, comprising:
   forming a first semiconductor region having a first surface, a first thickness and a first conductivity;
   forming a second semiconductor region having a second surface, a second thickness, an opposite conductivity opposite to the first conductivity and in contact with the first semiconductor region at a part of the first surface;
   forming a third semiconductor region having a third surface, a third thickness, the first conductivity and in contact with the second semiconductor region at a part of the second surface;
   making an impurity concentration of the third semiconductor region to be larger than a part of the second semiconductor region which is in contact with the third semiconductor region;
   forming a fourth semiconductor region having a fourth surface, a fourth thickness, an opposite conductivity type and in contact with the second semiconductor region at a part of the second surface; and
   making the fourth semiconductor region so as to be separated from the third semiconductor region and to enclose the third semiconductor region within a distance of minority carrier diffusion length of the second semiconductor region and making an impurity concentration of the fourth semiconductor region larger than that of the second semiconductor region.

2. The method of making the semiconductor device according to claim 1, wherein the fourth semiconductor region includes an opening in a plane shape which encloses the third semiconductor region, and a dimension of a smallest distance of the opening is smaller than or equal to one-tenth of a length of an inner perimeter of the plane shape which encloses the third semiconductor region.

3. The method of making the semiconductor device according to claim 1, wherein a surface impurity concentration of the fourth semiconductor region is more than or equal to ten times as much as that of the second semiconductor region.

4. A photoelectric conversion device, comprising:
   a first semiconductor region having a first surface, a first thickness and a first conductivity;
   a second semiconductor region having a second surface, a second thickness, an opposite conductivity opposite to the first conductivity and in contact with the first semiconductor region at a part of the first surface;
   a third semiconductor region having a third surface, a third thickness, the first conductivity and in contact with the second semiconductor region at a part of the second surface;
   a fourth semiconductor region having a fourth surface, a fourth thickness, an opposite conductivity type and in contact with the second semiconductor region at a part of the second surface;
   and a semiconductor region forming a photodiode with the first semiconductor region and being in connection with the second semiconductor region;
   an impurity concentration of said third semiconductor region being larger than a part of the second semiconductor region which is in contact with the third semiconductor region;
   said fourth semiconductor region being separated from the third semiconductor region and enclosing the third semiconductor region;
   an impurity concentration of said fourth semiconductor region being larger than that of the second semiconductor region.

* * * * *